(12) United States Patent
D'Aquino et al.

(10) Patent No.: US 6,992,512 B1
(45) Date of Patent: Jan. 31, 2006

(54) OUTPUT BUFFER

(75) Inventors: Danny D'Aquino, Sunnyvale, CA (US); Mehmet Aslan, Milpitas, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/397,664

(22) Filed: Mar. 25, 2003

(51) Int. Cl.
*H03B 1/00* (2006.01)

(52) U.S. Cl. ........................... 327/112; 327/108

(58) Field of Classification Search .............. 327/72, 327/74, 76, 108, 112, 170, 379, 389, 391, 327/427, 205, 206, 309, 313, 314, 320, 324, 327/325, 327, 328, 109–111, 333; 326/82, 326/83, 26, 27
See application file for complete search history.

(56) References Cited

U.S. PATENT DOCUMENTS

| | | | | |
|---|---|---|---|---|
| 4,786,824 A | * | 11/1988 | Masuda | 327/76 |
| 5,488,322 A | * | 1/1996 | Kaplinsky | 327/108 |
| 5,491,429 A | * | 2/1996 | Gasparik | 326/27 |
| 5,754,068 A | * | 5/1998 | Kumagai | 327/142 |
| 6,078,206 A | * | 6/2000 | Watarai | 327/320 |
| 6,566,910 B1 | * | 5/2003 | Joo | 326/83 |

OTHER PUBLICATIONS

Hodges et al., Analysis And Design Of Digital Integrated Circuits, 1988, McGraw-Hill Inc., $2^{nd}$ Edition, pp. 408-411.*

* cited by examiner

*Primary Examiner*—Long Nguyen

(74) *Attorney, Agent, or Firm*—Darby & Darby P.C.; Matthew M. Gaffney

(57) ABSTRACT

The present invention is related an output buffer that has one input pin and produces a two-bit output. The input levels are a ground voltage, a supply voltage, and a voltage that is halfway between ground and supply. The invention is related to producing a minimal current when the input voltage is halfway between the ground voltage and the supply voltage.

12 Claims, 6 Drawing Sheets

OUTPUT BUFFER

FIELD OF THE INVENTION

The present invention relates to the field of output buffers, and, in particular, to a buffer having inputs of supply, half-supply, and ground, the buffer having minimal current at half-supply.

BACKGROUND OF THE INVENTION

A buffer circuit is designed to respond to a predetermined range of input voltages and produce an output voltage that falls within a predetermined range. CMOS buffer circuits are mainly used for driving devices connected to an output stage, particularly devices having capacitance. If a signal bus in a memory has to drive a large load, or a clock signal has to drive a large load within a chip in a circuit only formed of logic devices, buffer circuits are needed for the bus signal and the clock signal.

DETAILED DESCRIPTION OF THE PREFERRED EMBODIMENT

Figure 1:
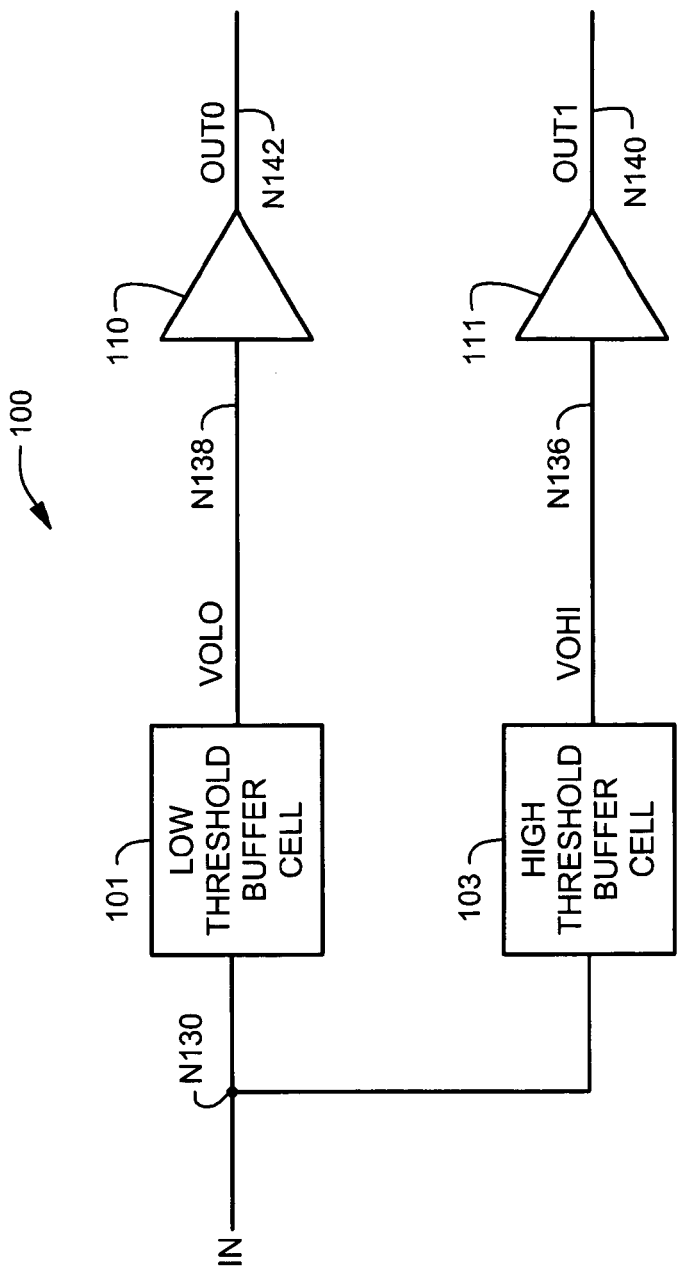
FIG. 1 illustrates an example output buffer circuit.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, charge, or data signal. Referring to the drawings, like numbers indicate like parts throughout the views.

The invention is related to an output buffer circuit that produces a two-bit output in response to an input signal with three voltage levels: ground, supply, and half-supply (half-way between ground and supply). The invention is related to minimizing quiescent currents when the input signal is at half-supply.

A single bit terminal may be used to produce multiple output bits. An input voltage is received by at least two buffer circuits, where each buffer circuit has a different threshold voltage. The buffer circuits may be current-limited, such that power consumption is limited.

A greater appreciation of the invention can be obtained with the more detailed description of output buffer circuit given below with references to FIG. 1 and FIG. 2.

FIG. 1 illustrates an example of an output buffer circuit (100) that is arranged in accordance with aspects of the present invention. Output buffer circuit 100 includes low threshold buffer cell 101, high threshold buffer cell 103, buffer 110 and buffer 111.

Low threshold buffer cell 101 has an input that is coupled to node N130 and an output that is coupled to node N138. High threshold buffer cell 103 has an input that is coupled to node N130 and an output that is coupled to node N136. Buffer 110 has an input that is coupled to node N138 and an output that is coupled to node N142. Buffer 111 has an input that is coupled to node N136 and an output that is coupled to node N140.

Briefly stated, output buffer circuit 100 produces a two-bit output (OUT0, OUT1) in response to signal IN. Three different two-bit output codes may be produced depending on whether: 1) a voltage associated with signal IN is between $V_{SS}$ and a low threshold voltage, 2) the voltage associated with signal IN is between the low threshold voltage and a high threshold voltage, or 3) the voltage associated with signal IN is between the high threshold voltage and $V_{DD}$. According to one example, $V_{SS}$ is 0 V, the low threshold voltage is 800 mV, the high threshold voltage is 2.4 V, and $V_{DD}$ is 3.3 V.

In operation, an input signal (IN) is applied to node N130. Low threshold buffer cell 101 produces signal volo in response to signal IN. Low threshold buffer cell 101 produces signal volo corresponding to a particular logical level when the voltage associated with signal IN is less than the low threshold voltage ($V_{LOW}$), and low threshold buffer cell 101 produces signal volo corresponding to the opposite logical level when the voltage associated with signal IN is greater than the low threshold voltage.

High threshold buffer cell 103 produces signal vohi in response to signal IN. High threshold buffer cell 103 produces signal vohi corresponding to a particular logical level when the voltage ($V_{IN}$) associated with signal IN is less than the high threshold voltage ($V_{HI}$), and high threshold buffer cell 103 produces signal vohi corresponding to the opposite logical level when the voltage associated with signal IN is greater than the high threshold voltage.

According to one example of output buffer circuit 100, signals volo, vohi, OUT0, and OUT1 have the following values depending upon $V_{IN}$:

| | | | | |
|---|---|---|---|---|
| $V_{IN} < V_{LOW}$ | volo = $V_{SS}$ | vohi = $V_{SS}$ | OUT0 = 0 | OUT1 = 0 |
| $V_{LOW} < V_{IN} < V_{HIGH}$ | volo = $V_{DD}$ | vohi = $V_{SS}$ | OUT0 = 1 | OUT1 = 0 |
| $V_{IN} > V_{HIGH}$ | volo = $V_{DD}$ | volo = $V_{DD}$ | OUT0 = 1 | OUT1 = 1 |

According to one example, low threshold cell 101 and high threshold cell 103 are current limited, which reduces power consumption in output buffer circuit 100.

Buffer 110 is a standard buffer cell that operates between $V_{SS}$ and $V_{DD}$. Buffer 110 produces signal OUT0 in response to signal volo. Buffer 111 is a standard buffer cell that operates between $V_{SS}$ and $V_{DD}$. Buffer 111 produces signal OUT1 in response to signal voho. Signals OUT0 and OUT1 comprise the two-bit output of output buffer circuit 100.

Buffer 110 and buffer 111 are optional components that need not be included in output buffer circuit 100. Buffer 110 and buffer 111 may be Schmitt triggered. Alternatively, buffer 110 and buffer 111 may be logic gates, such as OR gates.

Figure 2:
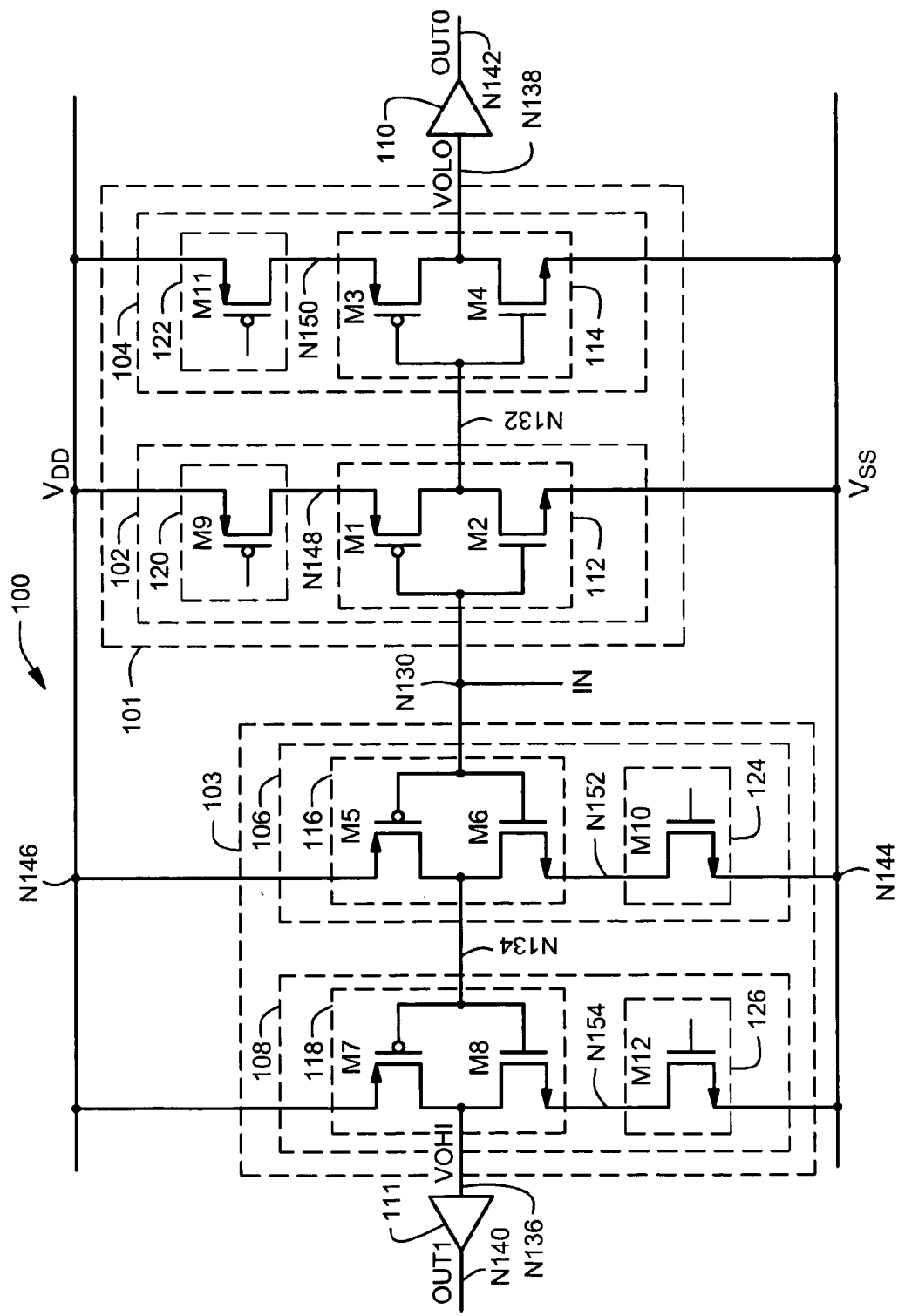
FIG. 2 illustrates another example output buffer circuit.

FIG. 2 illustrates an example of output buffer circuit 100 that is arranged in accordance with aspects of the present invention. FIG. 2 is substantially similar to FIG. 1, although an example of output buffer circuit 100 is shown in more specific detail.

According to the example illustrated in FIG. 2, low threshold buffer cell 101 comprises current-limited inverter cell 102. Current-limited inverter cell 102 comprises inverter cell 112 and current-limiting cell 120. Optionally, low threshold buffer cell 101 may further comprise current-limited inverter cell 104.

According to one example, inverter cell 112 is an inverter that provides an output at node N132 in response to signal IN. Rather than operating from $V_{SS}$ to $V_{DD}$, inverter cell 112 is arranged to operate between $V_{SS}$ and node N148. Current-limiting cell 120 is coupled between node N148 and $V_{DD}$, and is configured to limit the current associated with current-limited inverter cell 112. The device sizes of the components of inverter cell 112 (e.g. transistors M1 and M2) control the threshold of inverter cell 112. Current-limiting cell 120 also affects the threshold of inverter cell 112.

An input of current-limited inverter cell 104 may be coupled to the output of current-limited inverter cell 102. Current-limited inverter cell 104 increases the current-limited mid-voltage level range by decreasing the transistor region (increasing gain) of output buffer circuit 100. Current-limited inverter cell 104 comprises inverter cell 114 and current-limiting cell 122, which is coupled in series with inverter cell 114.

According to the example illustrated in FIG. 2, high threshold buffer cell 103 comprises current-limited inverter cell 106. Current-limited inverter cell 106 comprises inverter cell 116 and current-limiting cell 124. Optionally, high threshold buffer cell 103 may further comprise current-limited inverter cell 108.

According to one example, inverter cell 116 is an inverter that provides an output at node N134 in response to signal IN. Rather than operating from $V_{DD}$ to $V_{SS}$, inverter cell 116 is arranged to operate between node N152 and $V_{DD}$. Current-limiting cell 124 is coupled between $V_{SS}$ and node N152, and is configured to limit the current associated with current-limited inverter cell 116. The device sizes of the components of inverter cell 116 (e.g. transistors M5 and M6) control the threshold of inverter cell 116. Current-limiting cell 124 also affects the threshold of inverter cell 116.

An input of current-limited inverter cell 108 may be coupled to an output of current-limited inverter cell 106. Current-limited inverter cell 108 increased the current-limited mid-voltage level range by decreasing the transistor region (increasing gain) of output buffer circuit 100. Current-limited inverter cell 108 comprises inverter cell 118 and current-limiting cell 126, which is coupled in series with inverter cell 118.

Each of the inverter cells (112, 114, 116, and 118) may comprise two transistors connected in an inverter arrangement. According to the example shown in FIG. 2, inverter cell 112 comprises transistor M1 and transistor M2. Transistor M1 has a gate that is coupled to node N130, a drain that is coupled to node N132, and a source that is coupled to node N148. Transistor M2 has a gate that is coupled to node N130, a drain that is coupled to node N132, and a source that is coupled to node N144. According to the example shown in FIG. 2, inverter cell 114 comprises transistor M3 and transistor M4. Transistor M3 has a gate that is coupled to node N132, a drain that is coupled to node N138, and a source that is coupled to node N150. Transistor M4 has a gate that is coupled to node N132, a source that is coupled to node N144, and a drain that is coupled to node N138.

According to the example shown in FIG. 2, inverter cell 116 comprises transistor M5 and transistor M6. Transistor M5 has a gate that is coupled to node N130, a source that is coupled to node N146, and a drain that is coupled to node N134. Transistor M6 has a source that is coupled to node N152, a gate that is coupled to node N130, and a drain that is coupled to node N134. According to the example shown in FIG. 2, inverter cell 118 comprises transistor M7 and transistor M8. Transistor M7 has a gate that is coupled to node N134, a source that is coupled to node N146, and a drain that is coupled to node N136. Transistor M8 has a gate that is coupled to node N134, a drain that is coupled to node N136, and a source that is coupled to node N154.

Figure 3:
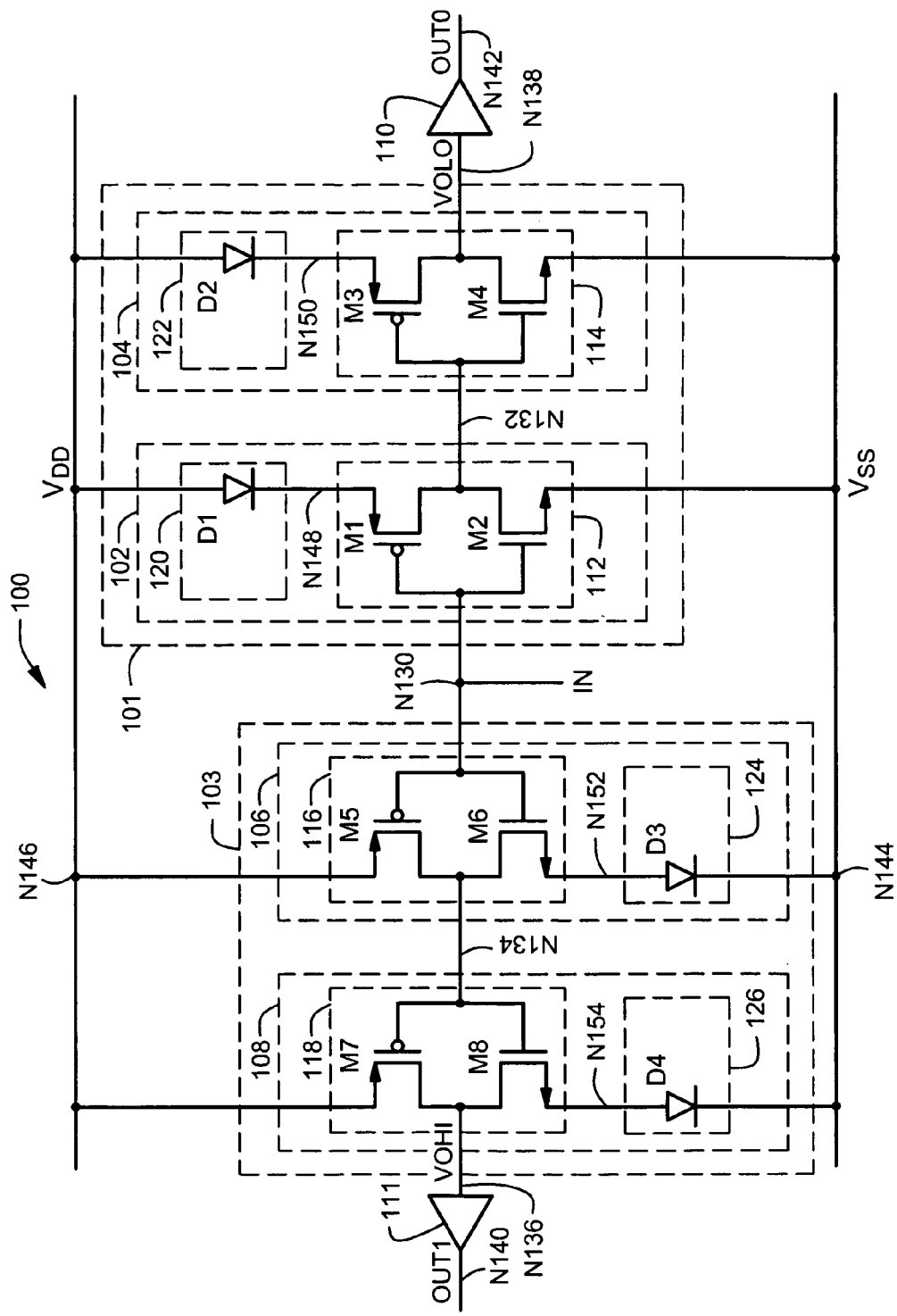
FIG. 3 illustrates an embodiment of the output buffer circuit of claim 2 in which the current limiting cells are implemented as diodes.

According to one example, each of the current-limiting cells (120, 122, 124, 126) comprises a transistor that is arranged to limit the current that is associated with the inverter cell. Many examples of current-limiting cells 120, 122, 124, and 126 are possible. One or more of the current-limited cells could comprise one or more resistors. One or more of the current-limited cells could comprise a diode, as illustrated in FIG. 3. One or more of the current-limited cells could comprise one or more transistors arranged to act as a current source. In one example, one or more of the current-limiting cells (120, 122, 124, and 126) is a controlled current source.

Figure 4:
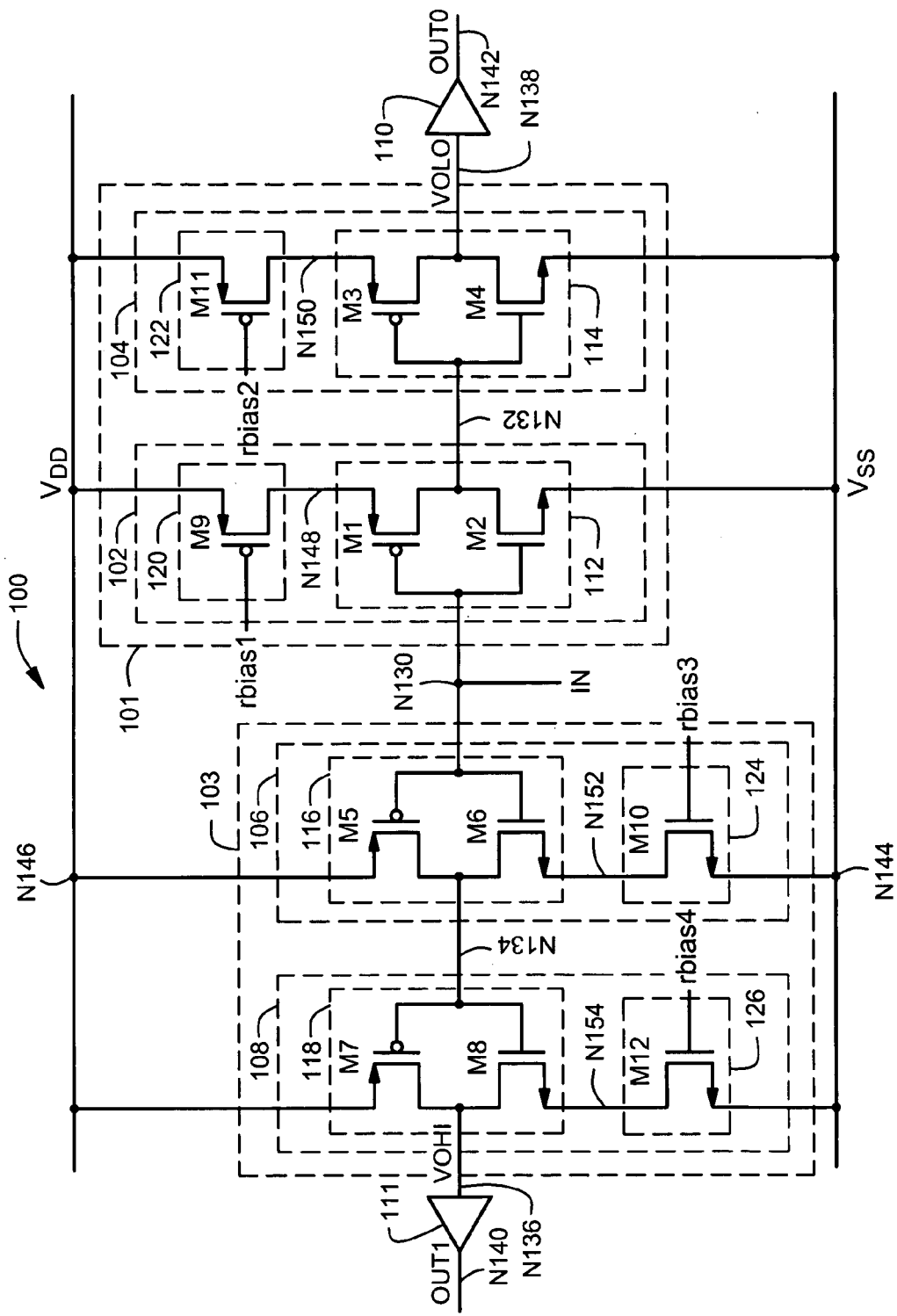
FIG. 4 illustrates an embodiment of the output buffer circuit of claim 2 in which the current limiting cells are implemented as transistors configured as resistors.
Figure 5:
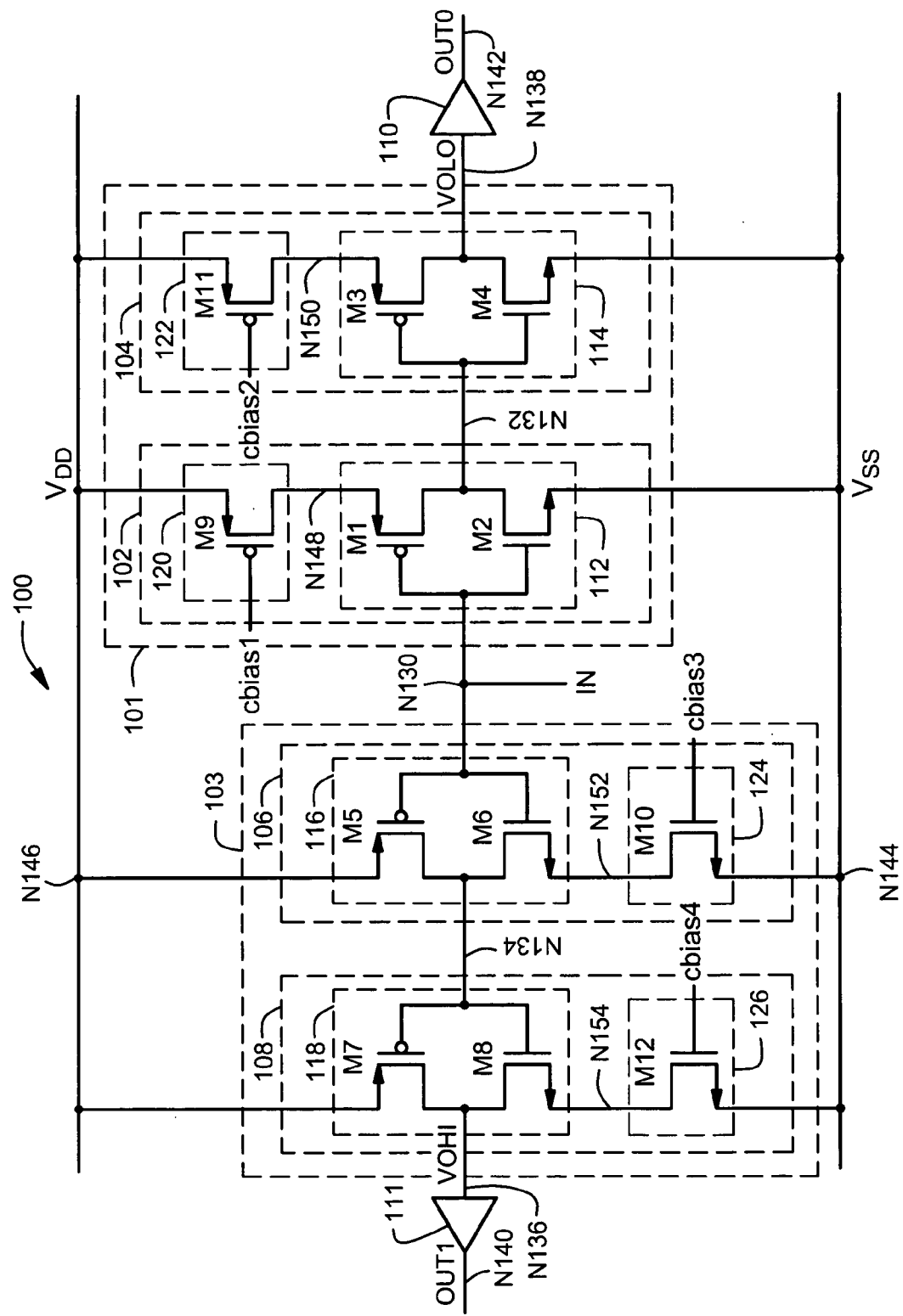
FIG. 5 illustrates an embodiment of the output buffer circuit of FIG. 2 in which the current limiting cells are implemented as transistors configured as current sources.
Figure 6:
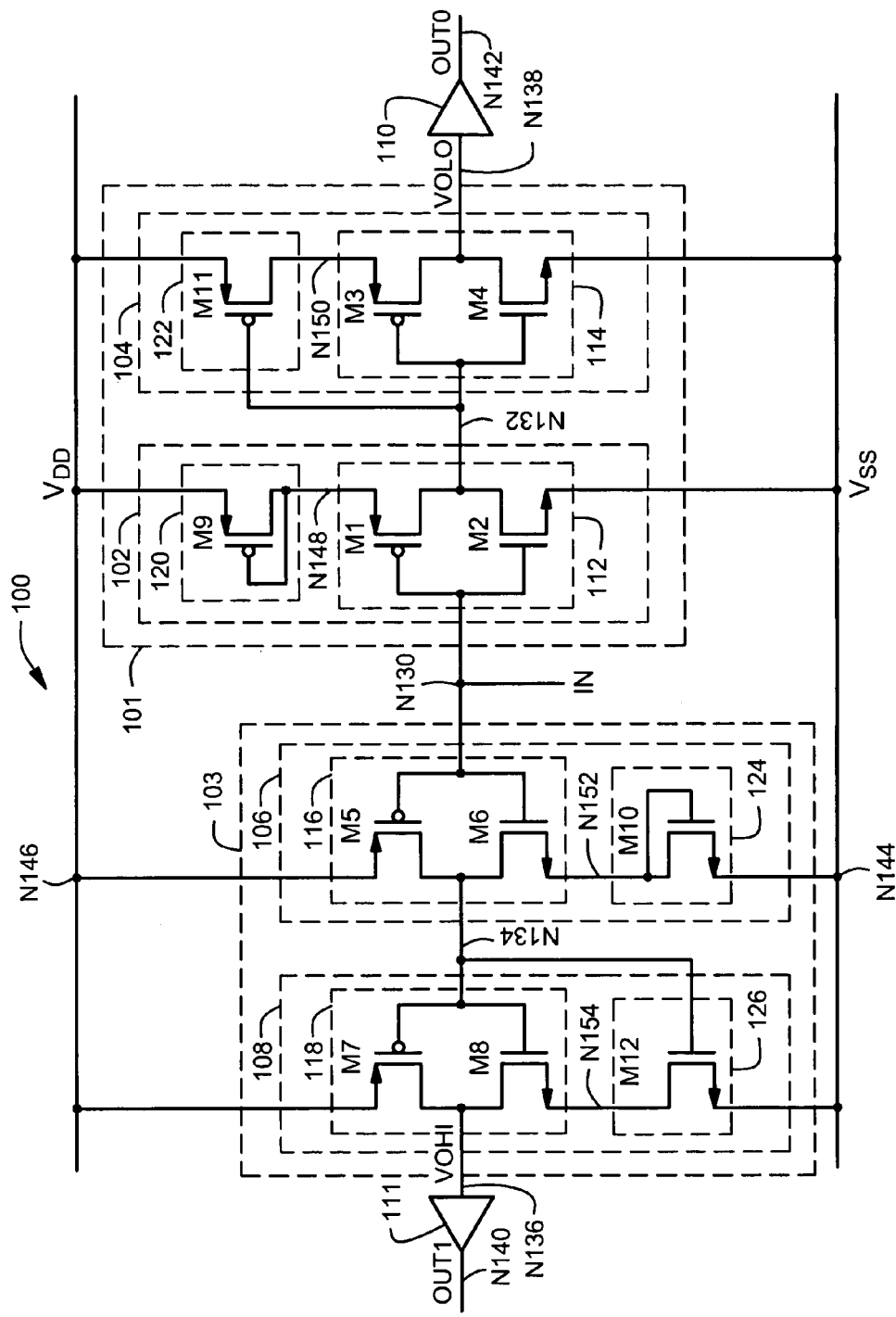
FIG. 6 illustrates an embodiment of the output buffer circuit of FIG. 2 in which two of the current limiting cells are implemented as transistors configured as diodes, and two of the current limited cells as implemented as transistors having gates coupled to the output of the preceding current-limited inverter cell, arranged in accordance with aspects of the present invention.

According to one example, one or more of the current-limiting cells (120, 122, 124, 126) may be a transistor that is sized for current limiting. In one example, one or more of the current limiting devices (120, 122, 124, 126) may be a transistor configured as a resistive device (as illustrated in FIG. 4). In another example, one or more of the current-limiting cells (120, 122, 124, and 126) may be a transistor with a gate that is coupled to a bias node to act as a current source (as illustrated in FIG. 5). According to another example, one or more of the current-limiting cells may be coupled to the input of the stage that it is in (as illustrated in FIG. 6). For example, current-limited device 122 may comprise transistor M11, and the gate of transistor M11 may be coupled to node N132, which is connected to the input of current limited inverter cell 104.

According to one example, as illustrated in FIG. 5, current-limiting cell 120 includes transistor M9, and transistor M9 is configured as a diode, with the gate of transistor M9 coupled to node N148. Transistor M9 is configured to limit the current associated with inverter cell 112. Similarly, according to one example, current-limiting cell 124 includes transistor M10, and transistor M10 is configured as a diode, with the gate of transistor M10 coupled to node N152. Transistor M10 is configured to limit the current associated with current-limited inverter 106.

As further illustrated in FIG. 5, current-limiting cell 122 may include a transistor M11, which may have a gate that is coupled to node N132. Signal volo can swing full rail if transistor M11 has a gate that is coupled to node N132 rather than being connected to node N150 in a diode configuration. Similarly, current-limiting cell 126 may include a transistor M12, which may have a gate that is coupled to node N134. Signal vohi can swing full rail if transistor M12 has a gate that is coupled to node N134 rather being connected to node N154 in a diode configuration.

Inverter cell 102 is shown in FIG. 2 such that current-limiting cell 120 is above inverter cell 112 (i.e., between inverter cell 112 and VDD). Alternatively, inverter cell 102 may be reversed so that current-limited cell 120 is below inverter cell 112 (i.e., between inverter cell 112 and VSS). Similarly, any of the other inverter cells (104, 106, and 108) may alternatively be reversed in a similar manner.

According to another alternative, one or more of the inverter cells (102, 104, 106, and 108) may not include a current limited cell (120, 122, 124, or 126).

The above specification, examples and data provide a complete description of the manufacture and use of the composition of the invention. Since many embodiments of the invention can be made without departing from the spirit and scope of the invention, the invention resides in the claims hereinafter appended.

We claim:

1. A CMOS output buffer circuit for providing first and second output signals in response to an input signal, comprising:
   a first PMOS transistor;
   a first NMOS transistor, wherein the first NMOS transistor and the first PMOS transistor are configured as a first inverter cell that is responsive to the input signal;
   a first current-limiting cell that is coupled between a supply node and a source of the first PMOS transistor such that an operating current associated with the first inverter cell is limited;
   a second PMOS transistor;
   a second NMOS transistor, wherein the second NMOS transistor and the second PMOS transistor are configured as a second inverter cell that is responsive to the output of the first inverter cell;
   a second current-limiting cell that is coupled between the supply node and a source of the second PMOS transistor such that an operating current associated with the second inverter cell is limited;
   a third PMOS transistor;
   a third NMOS transistor, wherein the third NMOS transistor and the third PMOS transistor are configured as a third inverter cell that is responsive to the input signal;
   a third current-limiting cell that is coupled between another supply node and a source of the third NMOS transistor such that an operating current associated with the third inverter cell is limited;
   a fourth PMOS transistor;
   a fourth NMOS transistor, wherein the fourth NMOS transistor and the fourth PMOS transistor are configured as a fourth inverter cell that is responsive to the output of the third inverter cell; and
   a fourth current-limiting cell that is coupled between the other supply node and a source of the fourth NMOS transistor such that an operating current associated with the fourth inverter cell is limited, wherein the first inverter cell is arranged to provide a first inverter output signal such that a voltage swing of the first inverter output signal is less than a rail-to-rail voltage and wherein the second inverter cell is arranged to provide a second inverter output signal such that a voltage swing of the second inverter output signal corresponds to the rail-to-rail voltage.

2. The CMOS output buffer circuit as in claim 1, further comprising:
   a first buffer circuit that is configured to provide the first output signal in response to an output of the second inverter cell; and
   a second buffer circuit that is configured to provide the second output signal in response to an output of the fourth inverter cell.

3. The CMOS output buffer circuit as in claim 1, the first current-limiting cell comprising a fifth PMOS transistor that is configured as a diode, the third current-limiting cell comprising a fifth NMOS transistor that is configured as another diode, the second current-limiting cell comprising a sixth PMOS transistor having a gate that is coupled to the output of the first inverter cell, and the fourth current-limiting cell comprising a sixth NMOS transistor having a gate that is coupled to the output of the third inverter cell.

4. The CMOS output buffer circuit as in claim 1, the first current-limiting cell comprising a fifth PMOS transistor that is configured as a current source, the third current-limiting cell comprising a fifth NMOS transistor that is configured as another current source, the second current-limiting cell comprising a sixth PMOS transistor having a gate that is coupled to the output of the first inverter cell, and the fourth current-limiting cell comprising a sixth NMOS transistor having a gate that is coupled to the output of the third inverter cell.

5. The CMOS output buffer circuit as in claim 1, the first current-limiting cell comprising a fifth PMOS transistor that is configured as a resistor, the third current-limiting cell comprising a fifth NMOS transistor that is configured as another resistor, the second current-limiting cell comprising a sixth PMOS transistor having a gate that is coupled to the output of the first inverter cell, and the fourth current-limiting cell comprising a sixth NMOS transistor having a gate that is coupled to the output of the third inverter cell.

6. An apparatus for providing a multiple bit output in response to an input signal, the apparatus comprising:
   a first threshold cell including a first current-limited inverter and a second current-limited inverter, wherein the first current-limited inverter consists of a first inverter and a first current-limiting cell; the first inverter includes an output; the second current-limited inverter consists of a second inverter and a second current-limiting cell; and wherein the second inverter is coupled to the output of the first inverter; and
   a second threshold cell including a third current-limited inverter and a fourth current-limited inverter, wherein the second current-limited inverter consists of a third inverter and a third current-limiting cell; the third inverter includes an output; the fourth current-limited inverter consists of a fourth inverter and a fourth current-limiting cell; the fourth inverter is coupled to the output of the third inverter; the first and third current-limiting cells each consist of exactly one of a diode, a transistor that is configured as a diode, or a transistor having a gate coupled to a predetermined bias voltage; the second current-limiting cell consists of a transistor having a gate that is coupled to the output of the first inverter; and wherein the fourth current-limiting cell consists of a transistor having a gate that is coupled to the output of the third inverter.

7. A circuit for providing a multiple bit output from an input signal, the circuit comprising:
   a first threshold cell including a first current-limited inverter and a second current-limited inverter, wherein the first current-limited inverter includes a first inverter and a first current-limiting cell; the first inverter includes an output; the first current-limited inverter is arranged to provide, at the output of the first inverter, a first inverter output signal in response to the input signal; the second current-limited inverter includes a second inverter and a second current-limiting cell; the second inverter is coupled to the output of the first inverter; the second current-limited inverter is arranged to provide a second inverter output signal in response to the first inverter output signal; the first current-limiting cell is arranged such that a voltage swing of the first inverter output signal substantially corresponds to a rail-to-rail voltage minus at least approximately a diode drop; and wherein the second current-limiting cell is arranged such that a voltage swing of the second inverter output signal substantially corresponds to the rail-to-rail voltage; and a second threshold cell including a third current-limited inverter and a fourth current-limited inverter, wherein the third current-limited inverter includes a third inverter and a third current-limiting cell; the third inverter includes an output; the third current-limited inverter is arranged to provide, at the output of the third inverter, a third inverter output signal in response to the input signal; the fourth current-limited inverter includes a fourth inverter and a fourth current-limiting cell; the fourth inverter is arranged to provide a fourth inverter output signal in response to the third inverter output signal; the third current-limiting cell is arranged such that a voltage swing of the third inverter output signal substantially corresponds to the rail-to-rail voltage minus at least approximately another diode drop; and wherein the fourth current-limiting cell is arranged such that a voltage swing of the fourth inverter output signal substantially corresponds to the rail-to-rail voltage.

8. The circuit of claim 7, further comprising:
a first buffer that is arranged to provide a bit of the multiple bit output from the second inverter output signal; and
a second buffer that is arranged to provide another bit of the multiple bit output from the fourth inverter output signal.

9. The circuit of claim 7, wherein the first and third current-limiting cells each consist of one of a diode, a resistor, a current source, a transistor that is configured as a diode, a transistor that is configured as a current source, or a transistor that is configured as a resistor; the second current-limited cell consists of a transistor having a gate that is coupled to the output of the first inverter; and wherein the fourth current-limited cell consists of a transistor having a gate that is coupled to the output of the third inverter.

10. A method for providing a multiple bit output from an input signal, the method comprising:
providing a first inverter output signal from the input signal such that a first current associated with the first inverter output signal is limited, and such that a voltage swing that is associated with the first inverter output signal substantially corresponds to a rail-to-rail voltage minus at least approximately a diode drop;
providing a second inverter output signal from the first inverter input signal such that a second current associated with the second inverter output signal is limited, and such that a voltage swing that is associated with the second inverter output signal substantially corresponds to the rail-to-rail voltage;
providing a third inverter output signal from the input signal such that a third current associated with the third inverter output signal is limited, and such that a voltage swing that is associated with the third inverter output signal substantially corresponds to the rail-to-rail voltage minus at least approximately another diode drop;
providing a fourth inverter output signal from the third inverter input signal such that a fourth current associated with the fourth inverter output signal is limited, and such that a voltage swing that is associated with the fourth inverter output signal substantially corresponds to the rail-to-rail voltage.

11. The method of claim 10, further comprising:
buffering the second inverter output signal to provide a bit of the multiple bit output; and
buffering the fourth inverter output signal to provide another bit of the multiple bit output.

12. An apparatus for providing a multiple bit output in response to an input signal, the apparatus comprising:
a first threshold cell that is configured to provide a first signal in response to the input signal such that a voltage associated with the first signal corresponds to a first logical level if the input signal is within a first pre-determined voltage range, and such that the voltage corresponds to a second logical level if the input signal is outside of the first pre-determined voltage range, wherein the first logical level is an inverse of the second logical level, the first threshold cell includes a first current-limited inverter cell and a second current-limited inverter cell, an input of the first current-limited inverter cell is configured to receive the input signal, an output of the first current-limited inverter cell is coupled to an input of the second current-limited inverter cell, the second current-limited inverter cell includes an inverter cell and a current-limiting cell, an output of the second current-limited inverter cell is arranged to provide the first signal, and wherein a first bit of the multiple bit output is derived from the first signal; and
a second threshold cell that is configured to provide a second signal in response to the input signal such that a voltage associated with the second signal corresponds to the first logical level if the input signal is within a second pre-determined voltage range, and such that the voltage corresponds to the second logical level if the input signal is outside of the second pre-determined voltage range, wherein the first predetermined voltage range is different from the second pre-determined voltage range; a second bit of the multiple bit output is derived from the second signal; the current-limiting cell is arranged to limit a current that is associated with the second current-limited inverter cell, and further arranged such that a voltage swing that is associated with the first signal substantially corresponds to a rail-to-rail voltage; the first current-limited inverter cell includes another inverter cell and another current-limiting cell; the first current-limited inverter cell is arranged to provide an inverter output signal to the first current-limited inverter cell; and wherein the other current-limiting cell is arranged to limit a current that is associated with the first current-limited inverter cell, and further arranged such that a voltage swing that is associated with the inverter output signal substantially corresponds to the rail-to-rail voltage minus approximately a diode drop.

* * * * *

UNITED STATES PATENT AND TRADEMARK OFFICE
CERTIFICATE OF CORRECTION

PATENT NO. : 6,992,512 B2
APPLICATION NO. : 10/397664
DATED : January 31, 2006
INVENTOR(S) : Dan D'Aquino et al.

It is certified that error appears in the above-identified patent and that said Letters Patent is hereby corrected as shown below:

Column 1,
Line 46, delete "EMBODIMENT" and insert -- EMBODIMENTS --.

Column 3,
Line 5, delete "voho." and insert -- vohi. --.

Column 5,
Line 9, delete "VDD" and insert -- $V_{DD}$ --.
Line 11, delete "VSS" and insert -- $V_{SS}$ --.
Line 63, after "voltage" insert -- , --.

Signed and Sealed this

Twenty-fifth Day of July, 2006

JON W. DUDAS
*Director of the United States Patent and Trademark Office*